United States Patent [19]
Lochhead et al.

[11] Patent Number: 6,039,897
[45] Date of Patent: Mar. 21, 2000

[54] MULTIPLE PATTERNED STRUCTURES ON A SINGLE SUBSTRATE FABRICATED BY ELASTOMERIC MICRO-MOLDING TECHNIQUES

[75] Inventors: Michael J. Lochhead; Paul Yager, both of Seattle, Wash.

[73] Assignee: University of Washington, Seattle, Wash.

[21] Appl. No.: 08/919,464

[22] Filed: Aug. 28, 1997

Related U.S. Application Data

[60] Provisional application No. 60/024,771, Aug. 28, 1996.

[51] Int. Cl.[7] .................................................. B29D 11/00
[52] U.S. Cl. ...................... 264/1.24; 264/250; 264/259; 264/260; 264/265
[58] Field of Search ................................. 264/1.24, 250, 264/259, 260, 265

[56] References Cited

U.S. PATENT DOCUMENTS

| 4,734,230 | 3/1988 | Rhodes, Jr. et al. .................. 264/46.4 |
| 5,356,588 | 10/1994 | Hara et al. ............................... 264/257 |

FOREIGN PATENT DOCUMENTS

97/07429  2/1997  WIPO .

OTHER PUBLICATIONS

Kim, E. et al. (1996), "Two–and Three–Dimensional Cyrstallization of Polymeric Microspheres by Micromolding in Capillaries," Adv. Mater. 8(3):245–247.

Kim, E. et al. (1995), "Combining Patterned Self–Assembled Monolayers of Alkanethiolates on Gold with Anisotropic Etching of Silicon to Generate Controlled Surface Morphologies," J. Electrochem. Soc. 142(2):628–633.

Schueller, O.J.A. et al. (1997), "Fabrication of Glassy Carbon Microstructures by Pyrolysis of Microfabricated Polymeric Precursors," Adv. Mater. 9(6):477–480.

Xia, Y. et al. (1997), "Replica Molding Using Polymeric Materials: A Practical Step Toward Nanomanufacturing," Adv. Mater. 9(2):147–149.

U.S. application No. 08/616,929, filed Mar. 15,1996.
U.S. application No. 08/397,635, filed Mar. 1, 1995.
U.S. application No. 08/485,457, filed Jun. 7, 1995.
U.S. Provisional application No. 60/007,058, filed Aug. 18, 1995.

Kim, E. et al. (1995), "Polymer microstructures formed by moulding in capillaries," Nature 376:581–584.

Kim, E. et al. (1997), "Solvent–assisted microcontact molding: A convenient method for fabricating three–dimensional structures on surfaces of polymers," Adv. Mat. 9(8):651–654.

Schueller, O.J.A. et al (1997), "Fabrication of glassy carbon micrstructures by pyrolysis of microfabricated polymeric precursors," Adv. Mater. 9(6):477–480.

(List continued on next page.)

*Primary Examiner*—Christopher A. Fiorilla
*Attorney, Agent, or Firm*—Greenlee, Winner & Sullivan, P.C.

[57] ABSTRACT

A method for patterning a material onto a substrate including the steps of: providing a micro-mold having a plurality of non-communicating independent channels and having a plurality of reservoirs for receiving a micro-molding fluid each of which reservoirs communicates with a channel, the micro-mold including an elastomeric master having a surface with a plurality of recesses therein and a substrate; introducing a micro-molding fluid into the micro-mold reservoirs filling said communicating channels; and solidifying the fluid in the micro-mold and removing the elastomeric master thereby generating a pattern of material on the substrate. The micro-mold is formed by contacting the surface of the elastomeric master with the substrate such that the recesses in the surface form the plurality of reservoirs and channels.

40 Claims, 6 Drawing Sheets

OTHER PUBLICATIONS

Qin, D. et al. (1997), "Elastomeric light valves," Adv. Mater. 9(5):407–410.

Xia, Y. et al. (1996), "Non–photolithographic methods for fabrication of elastomeric stamps for use in microcontact printing," Langmuir 12:4033–34038.

Zhao, X.–M. et al. (1997), "Fabrication of polymeric microstructures with high aspect ratios using shrinkable polystyrene films," Adv. Mater. 9(3):251–254.

Xia, Y. et al. (1997), "Replica molding using polymeric materials: A practical step toward nanomanufacturing," Adv. Mater. 9(2):147–149.

Qin, D. et al. (1996), "Rapid prototyping of complex structures with feature sized larger than 20 $\mu$m," Adv. Mater. 8(11)917–919.

Zhao, X.–M. et al. (1996), "Fabrication of three–dimensional microstructures: microtransfer molding," Adv. Mater. 8(10):837–840.

Zhao, X.–M. et al. (1996), "Fabrication of single–mode polymeric waveguides using micromolding in capillaries," Adv. Mater. 8(5):420–424.

Xia, Y. et al. (1996), "Complex optical surfaces formed by replica molding against elastomeric masters," Science 273:347–349.

Xia, Y. et al. (1996), "Micromolding of polymers in capillaries: applications in microfabrication," Chem. Mater. 8:1558–1567.

Kim, E. et al. (1996), "Micromolding in capillaries: applications in materials science," J. Am. Chem. Soc. 118:5722–5731.

Lochhead, M.J. et al. (1997), "Patterned sol gel structure by micromolding in capillaries," Material for Mechanical and Optical Micro Systems, M.C. Reed, et al. (eds.), MRS Symp. Proc. vol. 444, pp. 105–110, Mat. Res. Soc. Pittsburgh.

Brinker, C.J. and Scherer, G.W. (1990), *Sol–Gel Science: The Physics and Chemistry of Sol–Gel Processing*, Academic Press, Inc., Boston, pp. 506–507.

Klein, L.C. (1993), "Sol–Gel Optical Materials," Annu. Rev. Mater. Sci. 23:437–452.

Makenzie, J.D. (ed.) (1994) *Sol–Gel Optics III*, SPIE Proc. Ser. vol. 2288, SPIE Bellingham, WA, Table of Contents.

Coltrain, B.K. et al. (eds.)(1996) *Better Ceramics Through Chemistry VII: Organic/inorganic Hybrid Materials* MRS Symp. Proc. vol. 435, Mat. Res. Soc., Pittsburg, PA., Table of Contents.

Lev, O et al. (1995), "Organically–modified sol–gel sensors," Anal.Chem. 67:22A–30A.

Avnir, D. et al. (1994), "Enzymes and other proteins entrapped in sol–gel materials," Chem. Mater. 6:1605–1614.

Dave, B.C. et al. (1994), "Sol–Gel encapsulation methods for biosensors," Anal.Chem. 66:1120A.

Krug, H. and Schmidt, H. (1994) "Organic–inorganic nanocomposites for micro optical applications", New J. Chem. 18:1125–1134.

Yoshida, M. and Prasad, P.N. (1996) "Fabrication of channel waveguides from sol–gel processed polyvinylpyrrolidone/ $SiO_2$ composite material," Appl. Opt. 35:1500–1506.

Li, C.Y. et al. (1995) "Sol–gel integrated optic coupler by ultraviolet light imprinting," Electronics Lett. 31:271–272.

Mendoza, E.A. et al. (1994) "Photolithography of integrated optic devices in sol–gel glasses," *Sol–Gel Optics III* (J.D. Mackenzie, ed.) SPIE Proc. Ser. vol. 2288, pp. 580–588, SPIE Bellingham, WA.

Xu, C. et al. (1996) "Photoimageable, low shrinkage organic–inorganic hybrid materials for practical multimode channel waveguides," Chem. Mater, 8:2701–2703.

Holmes, A.S. et al. (1993) "Fabrication of buried channel waveguides on silicon substrates using spin–on glass," Appl. Optics 32:4916–4921.

Jeon, N.L. et al. (1995), "Patterning of dieletric oxide thin layers by microcontact printing of self–assembled monolayers," J.Mater.Res. 10 :2996–2999.

Motakef et al. (1995), "Optical loss study of MPEOU–based polyceram planar waveguides," Appl. Opt. 34:721–728.

Lochhead, M.J. and Yager, P. (1997), "Multi–component micro–patterned sol–gel materials by capillary molding," SPIE 3136:261–266.

Levy, D. and Esquivias, L. (1995), "Sol–Gel Processing of Optical and Electrooptical Materials," Adv. Mater. 7(2):120–128.

Wen, J. and Wilkes, G.L. (1996), "Organic/Inorganic Hybrid Network Materials by the Sol–Gel Approach," Chem. Mater. 8:1667–1681.

mask patterned silicon wafer

PDMS on wafer finished PDMS master
(channel side up)

PDMS master
(channel side down)

patterned ridges

Bar = 100 μm

MULTIPLE PATTERNED STRUCTURES ON A SINGLE SUBSTRATE FABRICATED BY ELASTOMERIC MICRO-MOLDING TECHNIQUES

CROSS-REFERENCE TO RELATED APPLICATIONS

This invention takes priority under 35 U.S.C. 119(e) from U.S. provisional application Ser. No. 60/024,771 filed Aug. 28, 1996 which is incorporated in its entirety by reference herein.

This invention was made at least in part with funding from the United States government under National Science Foundation grant number BES-9309041. The United States government has certain rights in this invention.

BACKGROUND OF THE INVENTION

Microfabrication technology has created new opportunities for chemical sensor design. The potential for rapid analysis and portability makes microfabricated devices attractive for applications ranging from remote chemical sensing to medical diagnostics. Microchip-based technologies for analysis of biological fluids, e.g., blood, are of significant interest.

Micro-molding in capillaries (MIMIC) is a technique for patterning organic polymer structures with micron dimensions (E. Kim, Y. Xia and G. M. Whitesides (1995) "Polymer microstructures formed by moulding in capillaries," *Nature* 376:581; E. Kim, Y. Xia and G. M. Whitesides (1996) *J. Amer. Chem. Soc.* 118:5722.) This technique is based on a mold consisting of a continuous network of channels formed when a patterned elastomeric "stamp" is brought into intimate contact with a substrate. Low-viscosity liquid prepolymer is then placed in contact with the open ends of the channels, which spontaneously fill by capillary action. After the polymer is cured, the elastomeric master is removed, leaving a patterned polymer structure. Subsequently, more details of MIMIC technique and a variety of applications of MIMIC have been reported. See, for example, Kim, E. et al. (1997), "Solvent-assisted microcontact molding: A convenient method for fabricating three-dimensional structures on surfaces of polymers," *Adv. Mat.* 9(8):651; Schueller, L. J. A. et al. (1997), "Fabrication of glassy carbon microstructures by pyrolysis of microfabricated polymeric precursors," *Adv. Mater.* 9(6):477; Qin, D. et al. (1997), "Elastomeric light valves," *Adv. Mater.* 9(5):407; Xia, Y. et al. (1996), "Non-photolithographic methods for fabrication of elastomeric stamps for use in microcontact printing," *Langmuir* 12:4033–4038; Zhao, X.-M. et al. (1997), "Fabrication of polymeric microstructures with high aspect ratios using shrinkable polystyrene films," *Adv. Mater.* 9(3):251; Xia, Y. et al. (1997), "Replica molding using polymeric materials: A practical step toward nanomanufacturing," *Adv. Mater.* 9(2):147; Qin, D. et al. (1996), "Rapid prototyping of complex structures with feature sized larger than 20 $\mu$m," *Adv. Mater.* 8(11):917; Zhao, X.-M. et al. (1996), "Fabrication of single-mode polymeric waveguides using micromolding in capillaries," *Adv. Mater.* 8(5):420; Xia, Y. et al. (1996), "Complex optical surfaces formed by replica molding against elastomeric masters," *Science* 273:347; Xia, Y. et al. (1996), "Micromolding of polymers in capillaries: applications in microfabrication," *Chem. Mater.* 8:1558.

Zhao, X.-M. et al. (1996), "Fabrication of three-dimensional microstructures: microtransfer molding," *Adv. Mater.* 8(10):837 report a technique related to MIMIC called microtransfer molding ($\mu$TM) in which lengthwise channels in a PDMS master are filled after which the filled master is placed on a substrate. Unlike MIMIC, the technique does not rely on capillary filing of the channels. A 3:1 mixture of ethanol with a 1:2 mixture of tetraethylorthosilicate:water (pH 1, using HCl as a catalyst) was employed in the $\mu$TM technique to generate $SiO_2$ structures after solvent in the precursor was removed by heating.

Most patterning technologies allow one material to be patterned at a time. Patterning multiple materials on the same substrate normally requires sequential masking, deposition, and/or etching steps. There are a number of applications for multi-component micropatterned substrates carrying independent structures composed of different materials. MIMIC and the related $\mu$TM technique provide a means for patterning a substrate with a single material. In one aspect, this invention provides a single-step molding method that can be used to pattern substrates with microstructures of different materials.

The sol-gel process is a solution chemistry route to inorganic and inorganic-organic hybrid materials. Sol-gel processing has received a tremendous amount of research attention in the last 15 years. The physics and chemistry of the process are described in detail in the textbook: C. J. Brinker and G. W. Scherer, *Sol-Gel Science: The Physics and Chemistry of Sol-Gel Processing,* Boston: Academic Press, Inc., 1990. In general, the process is based on the hydrolysis and condensation of metal alkoxides, particularly silicon alkoxides. At or near ambient conditions (temperature and pressure), the process yields a gel consisting of continuous solid and fluid phases. Various processing strategies can be used to control the porous microstructure of the final solid material. A variety of sol-gel materials have been formed, with the most common being oxides. Silica has received the most attention, particularly with regard to optics applications (L. C. Klein, "Sol-Gel Optical Materials," *Annu.Rev.Mater.Sci.* 1993, 23,437; J. D. Mackenzie (ed.) (1994) *Sol-Gel Optics III* SPIE Proc. Ser. Vol. 2288, SPIE Bellingham, Wash.)

A particularly attractive feature of sol-gels is the low processing temperature, which allows the incorporation of thermally-sensitive organic molecules and functional groups into the rigid inorganic sol-gel host matrix. As a result, organically modified silicas (ORMOSILs) and organic polymer-ceramic hybrid materials (CERAMERs or Polycerams) can be formed. In addition, organics ranging from dyes to proteins to whole cells have been successfully encapsulated in sol-gel materials (See, e.g., B. K. Coltrain, C. Sanchez, D. W. Schaefer, and G. L. Wilkes (eds.)(1996) *Better Ceramics Through Chemistry VII: Organic/inorganic Hybrid Materials* MRS Symp. Proc. Vol 435, Mat. Res. Soc., Pittsburg, Pa.) These are particularly important for chemical and biosensor applications (O. Lev, M. Tsionsky, L. Rabinovich, V. Glezer, S. Sampath, I. Pankratov, J. Gun, Organically-modified sol-gel sensors," *Anal. Chem.* 1995, 67,22A; D. Avnir, S. Bram, O. Lev, and M. Ottolenghl, "Enzymes and other proteins entrapped in sol-gel materials," (1994) Chem. Mater. 6: 1605–1614; B. C. Dave, B. Dunn, J. Selverstone-Valentine, J. I. Zink, "Sol-Gel encapsulation methods for biosensors, " *Anal. Chem.* 1994, 66,1120A.)

The ability to pattern these hybrid materials (i.e., organic/inorganic hybrids) is critical to the development of novel micro optical device and integrated optics applications. The patterning of sol-gel materials to date has been based primarily on techniques such as laser densification (H. Krug and H. Schmidt (1994) "Organic-inorganic nanocomposites for micro optical applications", *New J. Chem.*

18:1125–1134; M. Yoshida and P. N. Prasad (1996) "Fabrication of channel waveguides from sol-gel processed polyvinylpyrrolidone/$SiO_2$ composite material," Appl. Opt. 35:1500–1506); U. V. imprinting (C. Y. Li, J. Chisham, M. Andrews, S. I. Najafi, J. D. Mackenzie, and N. Peyghambarian (1995) "Sol-gel integrated optic coupler by ultraviolet light imprinting," Electronics Lett. 31:271–272); and photolithography (E. A. Mendoza, D. J. Ferrell, S. J. Syracuse, A. N. Khalil and R. A. Lieberman (1994) "Photolithography of integrated optic devices in sol-gel glasses," *Sol-Gel Optics III* (J. D. Mackenzie, ed.) SPIE Proc. Ser. Vol. 2288, pp 580–588, SPIE Bellingham, Wash.; C. Xu, L. Eldada, C. Wu, R. A. Norwood, L. W. Shacklette, J. T. Yardley, and Y. Wei (1996) "Photoimageable, low shrinkage organic-inorganic hybrid materials for practical multimode channel waveguides," Chem. Mater, 8:2701–2703; A. S. Holmes, R. R. A. Syms, I. Ming, and M. Green (1993) "Fabrication of buried channel waveguides on silicon substrates using spin-on glass," Appl. Optics 32:4916–4921.) Unfortunately, the radiation exposure and/or chemical treatments associated with these techniques are potentially incompatible with some hybrid sol-gel materials, particularly those containing dyes and biomolecules.

In one aspect, the invention described here is the combination of the chemical processing versatility of the sol-gel process with the fabrication versatility of MIMIC.

N. L. Jeon, P. G. Clem, R. G. Nuzzo, D. A. Payne, "Patterning of dielectric oxide thin layers by microcontact printing of self-assembled monolayers," *J. Mater. Res.* 1995, 10, 2996 describe methodology for patterning sol-gel layers using a technique called microcontact printing. The method employed is distinct from a capillary micro-moulding techniques in that an elastomeric stamp is first used to pattern a self-assembled monolayer (SAM) onto a sapphire substrate. A sol-gel film is then spin-coated onto the substrate. The sol-gel film has poor adhesion in the areas where the SAM has been formed. A subsequent mechanical cleaning step leaves an adherent, patterned oxide structure on the substrate. The spin-coating method described allows only one sol-gel composition to be deposited on a given substrate. PCT application WO 97/07429 "Self-assembled monolayer directed patterning of surfaces," published Feb. 27, 1997 relates to this SAM patterning method.

SUMMARY OF THE INVENTION

The present invention provides methods for patterning materials onto substrate surfaces which involve the use of elastomeric molds. The elastomeric mold is formed by placing an elastomeric master in conforming contact with the substrate surface. The elastomeric master comprises a surface with recessed features representing the pattern to be applied to the substrate. The recessed features in the elastomeric mold surface form a plurality of channels in the mold. Substrate patterning is accomplished by introducing a micro-molding fluid, that is a precursor of the material to be patterned on the substrate, into the mold channels. The fluid is introduced into the mold by capillary action.

In one aspect, this invention relates to the casting or molding of sol-gel materials on substrates using MIMIC techniques. These methods allow inorganic and inorganic/composite materials to be patterned on substrates. The method can employ aqueous sols, inorganic sols and organically-modified inorganic sol. Sols employed in the method can contain indicators, particularly indicator dyes and biologically active molecules.

Sols containing metal alkoxides are attractive for the generation of patterned metal oxide materials on substrates. Sols containing metal alkoxides which gel as a result of hydrolysis and condensation are particularly attractive because of the mild gelling and solidification conditions that are used.

Sol-gel MIMIC is a benign method for micron-scale patterning sol-gel materials onto a substrate. It represents a departure from traditional sol-gel patterning methods, which normally require light irradiation, chemical etching, and development. Sol-gel MIMIC is especially attractive for fabrication of devices containing sensitive dopants such as biomolecules.

In another aspect this invention provided improved MIMIC methods for patterning multiple micron-scale structures of organic, inorganic and inorganic/organic composite materials onto a single substrate in a simple molding step. The improved MIMIC method can be used with any micro-molding precursor fluids that have been employed in conventional MIMIC methods including among others prepolymer and monomer solutions, latex solutions, inorganic and organic salt solutions. The improved MIMIC methods are particularly useful in combination with sol-gel technology. Materials of different chemical composition and functionality can be patterned simultaneously at or near ambient conditions. The invention allows simple fabrication of a multi-functional device. Primary uses are in sensor, waveguide and integrated optics applications. In addition, the ability to cast multiple compositions simultaneously using improved MIMIC elastomeric mold designs eliminates the time-consuming and costly sequential processing normally required to pattern multiple materials.

The improved MIMIC method employs an elastomeric mold having a plurality of reservoirs for receiving micro-molding fluid. Each of the reservoirs communicates with a channel. The plurality of channels in the mold represent the patterning that is to be generated on the substrate. A mold channel is filled by introducing micro-molding fluid into a reservoir after which the channel fills by capillary action. The reservoirs and there connected channels are independent so that multiple materials can be patterned in a single step by introducing different micro-molding fluids into different reservoirs.

This invention includes processes for fabricating micron-scale structures, as well as structures and devices created by the process. Substrates carrying micron-scale independent channels each composed of a different material, for example, can be readily prepared by the disclosed method.

BRIEF DESCRIPTION OF THE FIGURES

FIG. 5A is a perspective view of the microfluid channel with patterned ridges. FIG. 5B is a top view of the microfluid channel of FIG. 5A. Ridges patterned in the channel contain indicator dyes responsive to analytes in the fluid sample. The exemplified fluid channel can be an element of a micro fluidic chemical analysis system. The channel is optically accessible through an optically transparent cover for detection of dye fluorescence.

DETAILED DESCRIPTION OF THE INVENTION

The improved MIMIC method of this invention is described by reference to FIGS. 1A–1G.

Figure 1A:
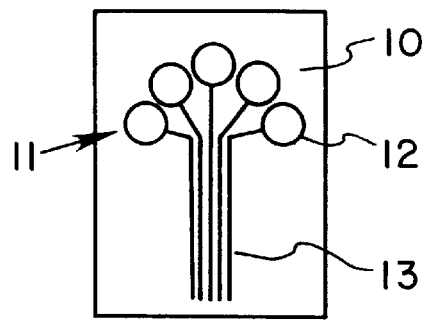
FIGS. 1A–1G illustrate the MIMIC method of this invention for single-step patterning of different materials.
Figure 1B:
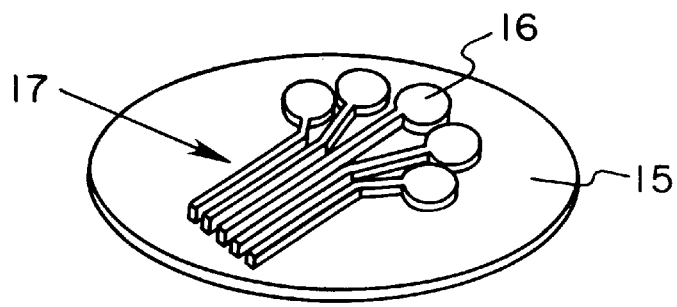

FIGS. 1A–1G illustrate the improved MIMIC method of this invention for single-step patterning of different materials on substrate surfaces. FIG. 1A illustrates the mask (10) containing a mask pattern (11) from which the patterned silicon wafer 15 of FIG. 1B is prepared by photolithography. Photolithography with reactive ion etching can be used to transfer the mask pattern onto a silicon wafer. After etching to the desired depth, the dark features of the mask were left as ridges on the wafer. The mask provides for independent channels (12) with interconnected reservoirs (13). The silicon wafer carries a raised replica (or positive relief) of the mask pattern with raised reservoir features (16) and ridges (17).

Figure 1C:
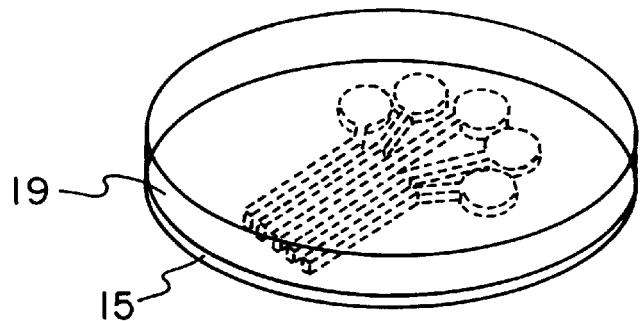
Figure 1D:
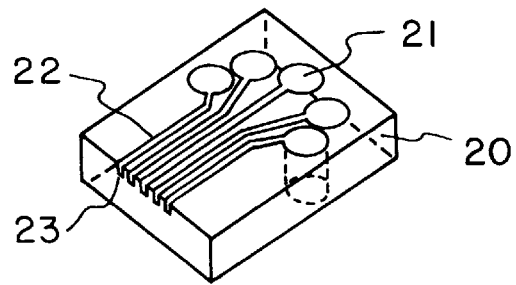

FIG. 1C illustrates the preparation of the elastomeric master (20) by pouring elastomer precursor onto the patterned silicon wafer (15) of FIG. 1B. FIG. 1D illustrates the finished elastomeric master (20) with multiple independent channels (22) and reservoirs (21) replicating pattern of the silicon wafer in negative relief. The master is finished by punching the reservoirs through the elastomer and cutting the master to open the channel ends. Each reservoir (21) extends through the master and the channel ends (23) are open. The elastomeric master can be formed by flowing unpolymerized polydimethylsiloxane (PDMS, Dow-Corning Sylgard 184) onto the etched wafer (15) and allowing it to cure. After curing and removal, the PDMS master possessed a negative relief of the final desired geometry. Excess PDMS is simply cut away, and access to the circular reservoirs is created by punching holes.

Figure 1E:
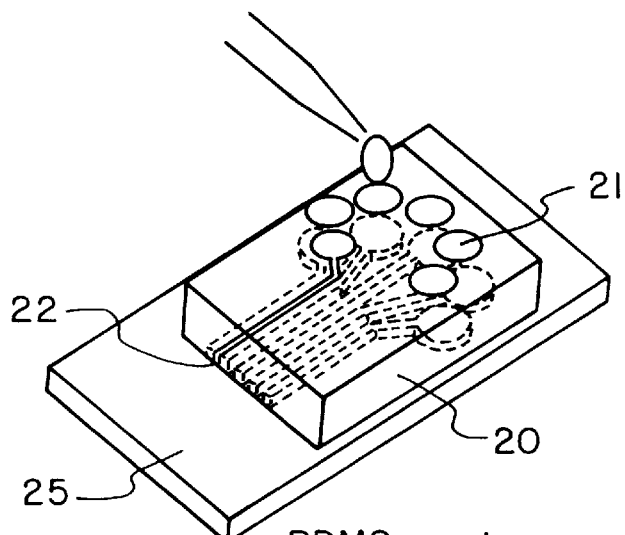
Figure 1F:
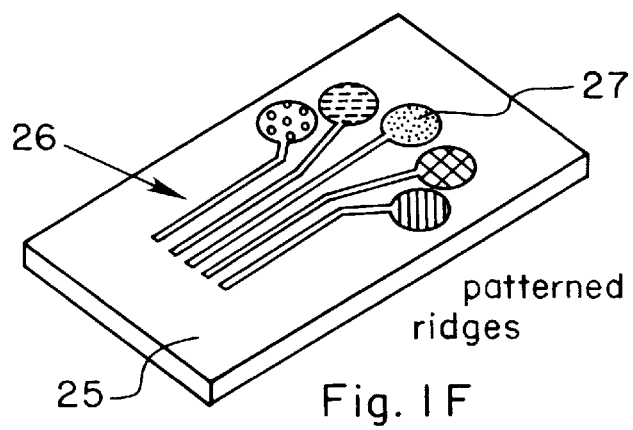
Figure 1G:
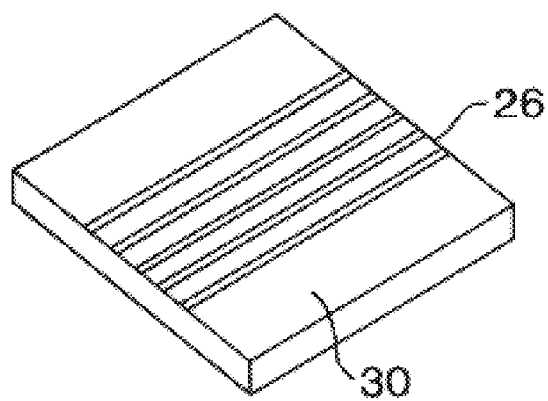

FIG. 1E illustrates the single-step MIMIC method. The master of FIG. 1D (20) is positioned channel side-down on the substrate (25) and micro-molding fluid (the precursor to surface patterned material) is introduced into independent reservoirs of the elastomeric master. Fluids, including sols, fill the channel that extends from the reservoir by capillary action. Because the channels are not interconnected to each other and because of the separate reservoirs present in the mold, each channel can be filled with a different micro-molding fluid. The filled mold is aged, heated, irradiated or otherwise processed to form desired solid materials in the channels adhered to the substrate. FIG. 1F illustrates the substrate (25) carrying patterned surface structures, e.g., ridges (26) and reservoir areas (27). The different shading of the structures patterned on the surface in FIG. IF is used to indicate that the independent ridges can be composed of distinct materials. The substrate can be further processed by cleaving the portion carrying the reservoir areas (27) to provide a finished substrate (30) patterned with a plurality of ridges (26) as illustrated in FIG. 1G.

The casting or molding step of the MIMIC process of this invention is a single-step in which multiple compositions are patterned simultaneously. PDMS has been exemplified for making the elastomeric master, however, other elastomer material can be employed. Preferred elastomers are those to which the patterning material does not substantially adhere.

In general the improved MIMIC method provide herein can employ any micro-molding fluids, including prepolymers, monomer solutions, inorganic or organic salts solutions and the like that have previously been employed in MIMIC methods reported in the literature. A variety of substrates can be patterned using this technique including $Si/SiO_2$, $Ti/TiO_2$, other metal oxides (Ni/NiO), glasses, sapphire, metal nitrides, semiconductor material (e.g., Gallium arsenide, Cadmium selenide, etc.) and non-reactive metals (e.g., platinum, gold, etc.). Preferred substrates are those to which the patterning material substantially adheres.

The MIMIC method of this invention is particularly useful in the casting of patterns from micro-molding fluids that are sols. Of particular interest are inorganic sols that gel in the mold and generate silica structures on substrates and related inorganic glassy patterned materials on substrates. In particular, sol useful in this invention can comprise precursors of metal oxide materials. Sols can include a mixture of metal oxide precursors that will provide for patterning of mixed metal oxide materials on substrates. These inorganic sols can be modified to incorporate organic materials to improve properties of the patterned structures.

The method of FIGS. 1A–1G has been exemplified with sols containing silica precursors that are organosilanes, particularly alkoxysilanes. Mixtures of alkoxysilanes and titanium alkoxides have also been used as metal oxide precursors in sols of this invention. In the metal alkoxide sols of this invention acid catalyzed hydrolysis and condensation reactions lead to gel formation from sols in the molds. These gels are hardened with aging to form the patterned metal oxide materials on the substrate. Alternative, metal oxide precursors include metal salts and complexes that can be hydrolyzed and condensed to form gels.

In general, micro-molding fluids can comprise indicators that are responsive to analytes (to give a color change, fluorescence or other detectible signal on interaction with the analyte). Preferred indicators are dyes that change color or produce florescence on interaction with an analyte. Indicator dyes in which the analyte response is reversible are more preferred. Incorporation of these indicators in the micro-molding fluid allows selective incorporation of indicators in patterns on substrate surfaces.

Micro-molding fluids can comprise a variety of biologically active molecules including proteins, enzymes, antibodies, antigens and nucleic acid which bind to, or otherwise react or interact with analytes including other biologically active molecules.

Micro-molding fluids can further comprise whole biological cells and/or cell fractions (e.g., cell wall preparations and the like.) Whole cells have been successfully entrapped in sol-gel systems.

Micro-molding fluids are solidified in the mold by a variety of methods. Prepolymer and/or monomer solutions can be solidified by addition of polymerization catalyst, by crosslinking induced by heating or by U.V. irradiation or similar known methods. Solvent can be removed from inorganic (and organic) salt solutions to crystallize out patterned material. Sols are catalytically gelled and further solidified and/or hardened by aging at ambient or by moderate heating (preferably up to about 100° C.) For silica inorganic sols and organically modified inorganic silica sols, sols gelled in the molds within about 24 h. Gels were allowed to age for 2–7 days in the mold before the mold was removed to provide the patterned substrate.

Figure 2:
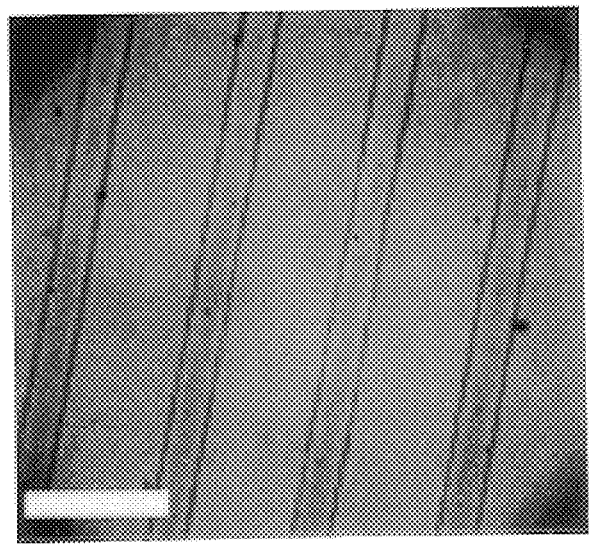
FIG. 2 is an optical microscope image of silica gel ridges prepared on a glass microscope slide using the MIMIC method illustrated in FIGS. 1A–1G.

FIG. 2 is an optical microscope image of silica gel ridges (approximately 20 $\mu$m wide and 1 $\mu$m high) prepared on a glass microscope slide using the MIMIC method illustrated in FIGS. 1A–1G as described in Example 2 using 1:2:2 $TEOS:H_2O:ethanol$ (with HCl catalyst) as the micromolding fluid. (No solvent pre-wetting step was employed). The scale bar on the image is 100 μm.

Areas of concern for application of the sol-gel process to MIMIC were the speed of mold filing and fabrication of crack-free patterned products. The ability of the sol to fill the PDMS-on-glass mold (FIG. 1E) depends on factors such as viscosity of the fluid and surface tension in fluid and mold (as discussed in Kim et al. (1995) supra and Kim et al. (1996) supra). Organic/inorganic hybrid sols are, by nature, complicated mixtures containing alkoxides, polymers, water, and solvent. In general, increasing the solvent (alcohol) fraction lowers both viscosity and surface tension and greatly facilitates mold filling. However, increasing the solvent content also leads to significant shrinkage which, in turn, was found to result in cracking of the patterned material. Sol casting in sol-gel MIMIC, therefore, involves striking a balance between competing factors: the desire to fill the mold (completely and in a practical time) and the desire to fabricate crack-free patterned products.

It has been noted that inorganic sol-gel films thicker than 1 μm are very difficult to dry without cracking (Brinker, C. J. and Scherer, G. W. (1990), *Sol-Gel Science: The Physics and Chemistry of Sol Gel Processing*, Academic Press, Boston, p. 506). Patterned structures with thicknesses of 5 to 50 μm on rigid substrates are of particular interest for sensor, diagnostic and related applications. Optical signal transduction in devices with greater than about 5 μm dimensions do not typically require surface-enhanced techniques and are currently more attractive for sensor and biosensor design applications. Consequently, cracking was expected to be a problem in application of the sol-gel MIMIC. When cast in micro molds having 5 to 50 μM deep channels, the simple inorganic silica gels invariably cracked during drying. Interestingly, when the same inorganic sols were cast in molds ≦1 μm deep, crack-free patterns were readily formed. The 1 μm rule-of-thumb stated for inorganic sol gel films appears to apply to inorganic sol-gel MIMIC materials as well.

Organic polymer modification of the silica sols was used to inhibit gel cracking during fabrication of patterns higher than about 1 μm (e.g., using molds deeper than about 1 μm.) Using sol compositions suggested by Motakef et al. (1995), "Optical loss study of MPEOU-based polyceram planar waveguides," Appl. Opt. 34:721–724, PEOU alkoxide was added to the 1:2:2 TEOS sol in a 3:1 TEOS:PEOU weight ratio and was refluxed for 30 minutes with rapid stirring. After cooling, organic dye dopants and other sol additives can be to the sol.

When cast in molds ≦10 μm thick, the TEOS-PEOU sols would flow into the microchannels a few millimeters and then stop. Part of the poor filling properties of this sol can be attributed to the increased viscosity and hydrophobicity associated with PEOU. Partial filling followed by cessation of flow also suggests a change in the sol properties during mold filling. Increasing viscosity, surface tension, or even premature gelation would all yield the observed behavior. To explain the poor mold-filling observations, we hypothesized that the PDMS was selectively removing ethanol from the sol. A decrease in the relative ethanol concentration would increase sol viscosity and surface tension, inhibiting flow.

Figure 3:
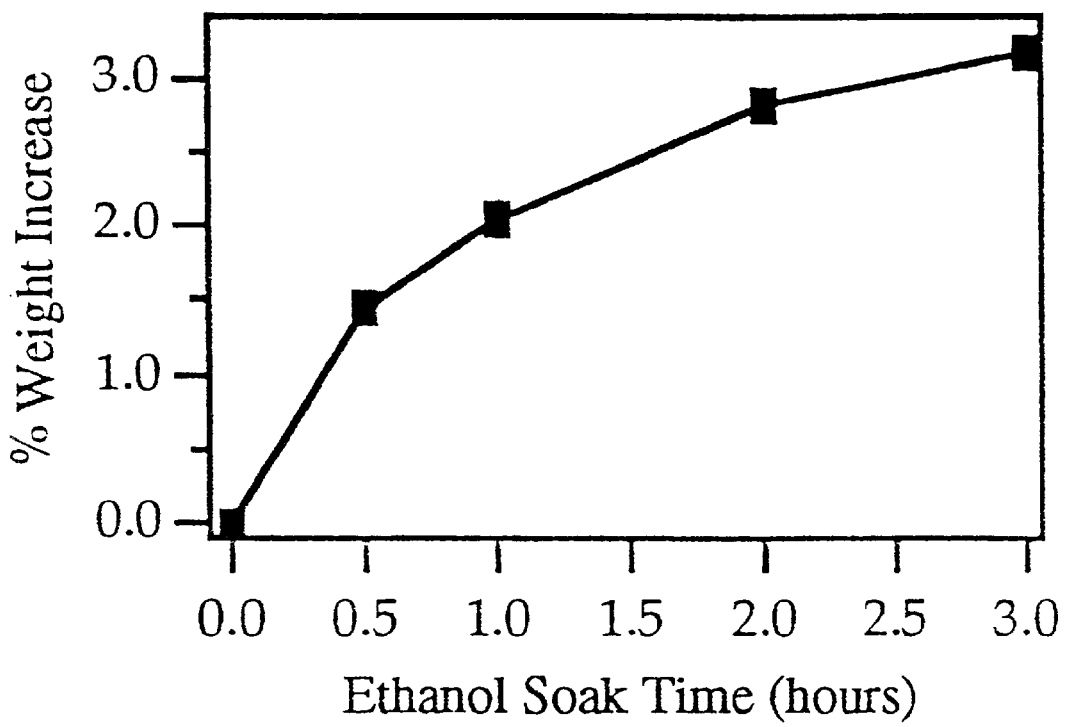
FIG. 3 is a graph of ethanol absorption into PDMS cubes.

To test whether PDMS absorbs ethanol, a simple experiment was performed. Cured PDMS was cut into 0.25 gram elongated cubes with 5×5×10 mm dimensions. The cubes were soaked in absolute ethanol for set periods of time, quickly blown dry, and then weighed. FIG. 3 is a graph of ethanol absorption into PDMS cubes with dimensions 0.5× 0.5×1.0 mm as a function of time. This data indicates that ethanol absorption by the PDMS master from sol introduced into the is significant. While the kinetics of the solvent absorption depend on the geometry of the PDMS mold, the results qualitatively show that the absorption is relatively rapid. Since our micro channels have a large surface-to-volume ratio, ethanol extraction from the precursor sol is likely significant.

Pre-soaking the PDMS master in ethanol prior to sol casting facilitated mold filing of organically-modified sols (TEOS:PEOU sols). Channels up to several cm in length could be employing the solvent pre-soaking step. It is believed that the solvent pre-soak of the mold inhibited selected solvent absorption form the sol as it filled the mold. The solvent pre-soak was done by immersing the entire mold in solvent (e.g., alcohol, specifically ethanol) followed by blowing off excess solvent remaining on the mold once it was removed from the solvent bath. It is believed that this pre-soak functioned to pre-wet the channels in the mold inhibiting solvent absorption and facilitating channel filing. Mold pre-wetting to facilitate channel filing can be accomplished by immersion of the mold in solvent or more preferably by introducing solvent into the mold channels prior to filing the molds with micro-molding fluid. For example, reservoirs in elastomeric molds can be filled with solvent which is then allowed to fill the channels. After solvent is allowed to adsorb into the elastomer, excess solvent can be blown from the mold and the micro-molding fluid (e.g., sols) can be introduced into the reservoirs.

The integrity of the PDMS-glass substrate contact may be compromised under the ethanol pre-soak conditions. When cast in pre-soaked PDMS masters, partial sol underflow between the PDMS and the glass substrate was observed. Underflow did not appear to alter the microscopic properties of our devices.

Figure 4A:
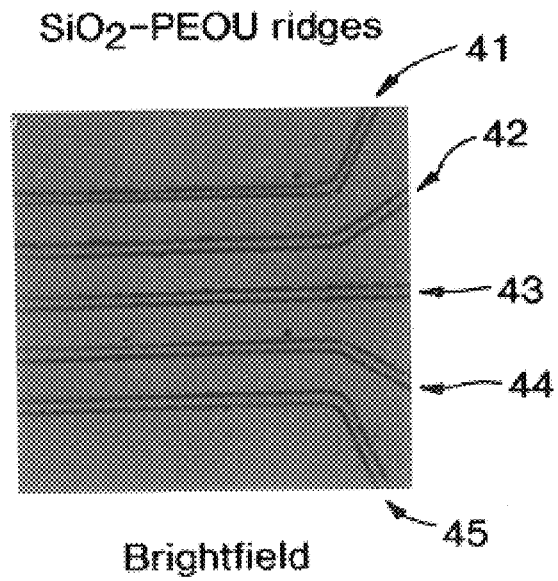
FIGS. 4A–C are optical microscope images in brightfield and/or epifluorescence mode of organically modified silica gel ridges formed on glass substrates using the MIMIC process of FIGS. 1A–1G.
Figure 4B:
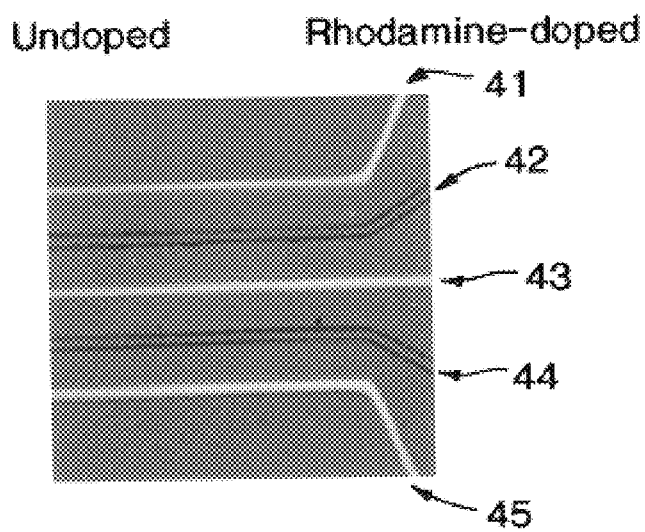
Figure 4C:
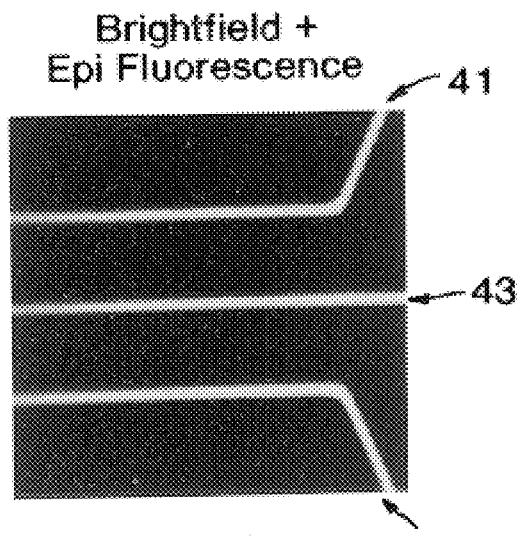

Patterned, organically modified sol-gel ridges are illustrated in the optical microscopy images of FIGS. 4A–C. The sample imaged in these figures was made with the TEOS-PEOU sol described above. The mold had channels approximately 10 μm thick, 20 μm side, and centimeters long. A solvent pre-wetting step (immersion of the mold) was applied prior to introduction of the sol into the mold. The PDMS master was removed after gelation and aging for 6 days. The molding process proceeded with remarkable fidelity. Roughness observed in the original silicon wafer was transferred first to the PDMS master and then to the patterned silica gel structures.

Most patterning technologies allow one material to be patterned at a time. Patterning multiple materials on the same substrate normally requires sequential masking, deposition, and/or etching steps. Sequential patterning steps are avoided by using the elastomeric mold with independent channels illustrated in FIG. 1E. The substrates imaged in FIG. 4A–C were prepared using an elastomeric mold having five independent reservoir and channel systems which allowed five separate sols to be cast simultaneously in a single molding or casting step.

FIGS. 4A–C are optical microscope images of organically modified silica gel ridges formed. FIG. 4A is a brightfield image of the five independent $SiO_2$-PEOU ridges (41, 42, 43, 44, 45) formed on a glass substrate. Ridges 41, 43 and 45 contained the fluorescent dye rhodamine 6G. The dye was included in the precursor sol used to create ridges 41, 43 and 45 at a level of about 1 mg/ml. FIG. 4B is a brightfield+epi-fluorescence optical microscope image of the same ridges of FIG. 4A, showing fluorescence of ridges 41, 43 and 45 in contrast to other ridges. FIG. 4C is an epi-fluorescence mode image of the same ridges of FIGS. 4A and B indicating that only ridges 41, 43 and 45 containing the dye exhibit fluorescence.

FIGS. 4A–4C clearly demonstrate that the improved MIMIC method of this invention allows the fabrication of closely spaced micro-scale ridges of different chemical compositions in a single substrate.

The ability to cast multiple materials simultaneously, as demonstrated here, is extremely attractive for the development of micro-optical devices such as miniature, multi-analyte chemical sensors. Micro-optical chemical sensor and biosensor devices capable of sensing a plurality of different chemical or biological analytes can be generated by incorporating appropriate indicators and/or biologically active components in the micro-molding fluid used in the MIMIC method of this invention. The sol-gel MIMIC methods disclosed herein are particularly attractive for entrapment and or incorporation of such indicators and biologically active components because mild gelling and solidification methods that do not destroy or inactive these components can be employed.

The sol-gel MIMIC process described herein can be used to prepared relatively long (centimeters), relatively high 50 $\mu$m or taller micro structures on substrates without significant cracking on drying.

Patterned substrates prepared by the MIMIC methods of this invention are useful in a variety of sensing, diagnostic, and optical applications. Sol-gel MIMIC substrates of this invention are particularly useful in the fabrication of new, multi-functional sensor materials. The methods are applicable to the wide range of sol-gel sensor materials have been demonstrated in recent years. Sol-gel MIMIC allows multiple sensor materials to be formed on a single substrate, creating a multi-functional sensor device.

Figure 5A:
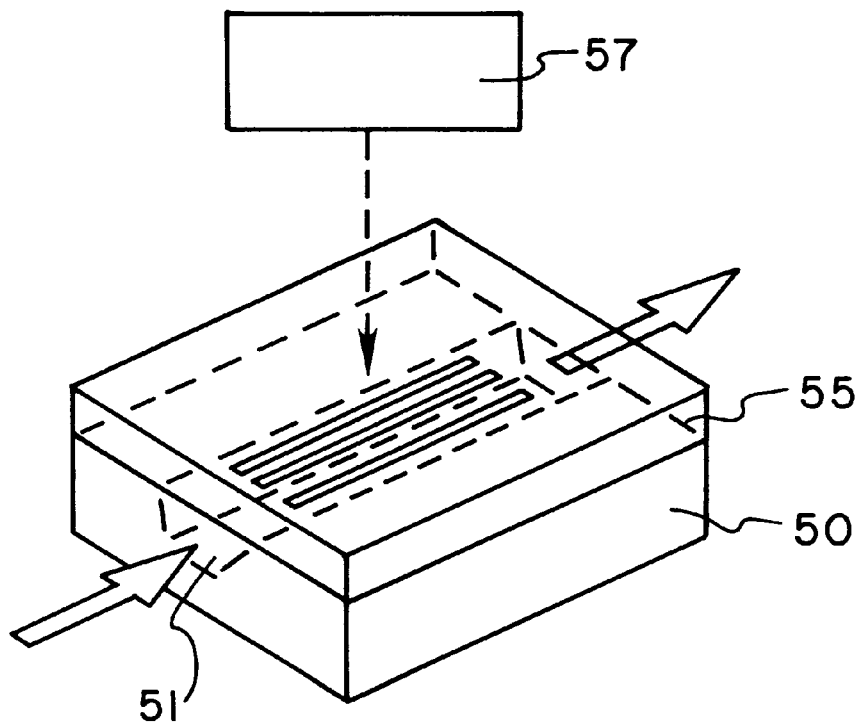
FIGS. 5A and 5B illustrate a patterned micro fluid channel prepared by the MIMIC method of FIGS. 1A–1G.
Figure 5B:
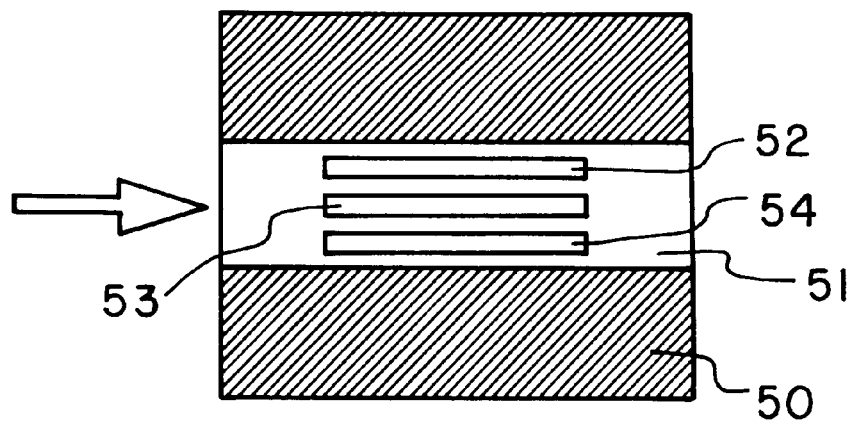

FIGS. 5A and 5B illustrate a patterned micro fluid channel 51 prepared by the MIMIC method of FIGS. 1A–1G. FIG. 5A is a perspective view of the patterned microfluid channel with transparent cover and FIG. 5B is a top view of the patterned microfluid channel. Ridges patterned in the channel (52–54) contain different indicator dyes responsive to analytes in the fluid sample that is passed or held in the fluid channel. The exemplified fluid channel is formed with an etched and patterned silicon wafer (50) and an optically transparent cover (55). The fluid channel can be an element of a micro fluidic chemical analysis system with appropriate means for fluid sample introduction (not shown) and a means for detecting indicator response to analytes (schematically shown as detector 57). Each patterned ridge can contain a distinct indicator dye (or other immobilized sensing reagents)responsive to a particular analyte that may be present in fluid passed through the micro channel. The channel is shown as optically accessible through an optically transparent cover (55) for detection of dye fluorescence from the sensor patterns on the wafer. Microscope detection methods, for example, can be used to detect fluorescence of indicator dyes. Alternatively, one or more waveguides can be provided adjacent the fluid channel in optical contact with the sensor ridges in the channel. Fluorescence of indicator dyes in the ridges can then be detected using standard light intensity measurements of light exiting the waveguide(s).

Sol-gel MIMIC patterned substrates of this invention can also be used in waveguide and integrated optics applications. Low losses (<0.2 dB/cm) have already been demonstrated in sol-gel planar and channel waveguides S. Motakef et al. 1994 supra. Sol-gel MIMIC can be employed to fabricate waveguides and integrated optics in electro-optic, non-linear optic and light amplification devices.

EXAMPLES

Example 1

Elastomeric Mold Preparation

Elastomeric masters for MIMIC were prepared essentially as described in Kim et al. (1995) supra ; Kim, E. et al. (1996) supra; Xia, Y. et al. (1996), Science supra; Xia, Y. et al. (1996), Chem. Mater. supra. with modifications of the master design as illustrated in FIGS. 1A–1D to allow for generation of independent micro-sized channels. A multi-channel mask (e.g., FIG. 1A) was designed using CAD software. The circular pads contiguous with each channel which provide for the reservoirs were typically approximately 5 mm in diameter. In a specific mask five lines (for five independent channels) were 10 to 20 $\mu$m wide separated by 100 $\mu$m on center, and were up to three centimeters long. Mask lines down to about 1 $\mu$m wide can be prepared. The mask pattern was transferred to silicon wafers using photolithography with reactive ion etching. Etching depths for different samples ranged from approximately 1 to 50 $\mu$m, yielding three-dimensional ridge raised structures on the silicon wafer. Each wafer was placed in a dish into which liquid polydimethylsiloxane (PDMS, Dow-Corning Sylrad 184) was poured. After curing, the transparent, flexible PDMS elastomer master was peeled off of the silicon wafer, which could be then be reused to make more PDMS masters. Final preparation of the master involved punching holes in the PDMS to expose the circular reservoirs, opening the channel ends, and then cutting the master to size. The thickness of the elastomer was typically 2–5 mm.

Example 2

Multi-component MIMIC

The PDMS master of Example 1 is placed channel-side down onto a substrate such as a glass microscope slide to form a micro-mold. The master makes conformal contact with the substrate and creates a series of independent micro channels with independent reservoirs in the micro-mold. Fluids were introduced into the molds via individual reservoirs. For example, sols were cast by placing a drop in the cylindrical reservoir of the mold. Alternatively, a drop of fluid can be placed at the open edge of a micro channel. The five reservoir mold illustrated in the FIGS. 1A–1G allows five different materials, e.g., five different sols, to be cast (or molded) simultaneously in a single-step procedure. Sols are allowed to gel by aging at ambient temperature with the PDMS master in place. Other fluid precursors are gelled, hardened, crystalized or otherwise solidified in the mold using appropriate aging, heating or chemical reaction conditions.

The MIMIC method of this invention is illustrated with sol-gel materials. Acid catalyzed tetraethoxysilane (TEOS, Gelest) was used as the silica source. Silica sols (e.g., inorganic TEOS sols) were prepared by mixing tetraethoxysilane (TEOS, Gelest), 0.15 M HCl, and absolute ethanol, typically in a 1:2:2 molar ratio. Silica sols were introduced into individual reservoirs of the mold of FIG. 1E and the channel connected to the reservoir filled by capillary action. Filing of the channel molds can be facilitated by application of vacuum and by solvent pre-wetting steps discussed in Example 3. Care should be taken when a vacuum is applied to avoid formation of air/gas bubbles in the sols or other fluids employed.

Organically-modified inorganic sols were also used to illustrate the method of FIGS. 1A–1G. TEOS sols were, for example, modified with N-triethoxysilylpropyl-O-polyethylene oxide urethane (PEOU, Gelest). PEOU was selected because it has been demonstrated as useful in the fabrication of low-loss organically modified silica waveguides (Motakef, S. et al. (1995), "Optical loss study of MPEOU-based polyceram planar waveguides," Appl. Opt. 34:721–728). In addition, polyethylene oxide polymers are attractive as non-fouling surfaces in biomaterial applications. Organically-modified inorganic sols were prepared with ethanol as a common solvent.

N-triethoxysilylpropyl-O-polyethylene oxide urethane (PEOU, Gelest) was added to the silica sol and the TEOS-:PEOU weight ratio was typically 3:1. The silica-PEOU sols were refluxed then for 30 minutes, cooled to room temperature, and divided into several volumes.

Organic dye dopants that were added to the sols included rhodamine 6G, carboxyfluorescein, and bromphenol blue. The organic dye when added was typically dissolved in an appropriate solvent, e.g.,ethanol, and the dye solution was added to the cooled sols with vigorous stiring. Dyes were typically added to the sol at a level of about 1 mg/ml. However, the dye concentration in the sol can be varied over a relatively wide range dependent upon the application and the dye. The dye level is selected to maximize signal intensity and minimize dye aggregation.

The sols gelled in the mold (about 24 h) to form a material with a rubbery consistency. The gels were aged from 2–7 days dependent upon sol composition before removing the PDMS master. Care must be taken to allow sufficient time for aging to avoid sticking of the gelled material to the elastomeric mold. When the PDMS master is removed, patterned sol-gel structures are left on the glass substrate. Alternatively, the sol in the mold can be subjected to moderate heating to gel and solidify the material. If heat is applied temperatures are selected to avoid inactivation or decomposition of any entrapped materials, such as dyes or biologically active materials. In addition, sol-containing molds and sol-gel patterned substrates should not be subject to temperature extremes to avoid cracking of the patterned materials.

Example 3

Solvent Pre-wetting

When cast in molds ≦10 μm thick, the TEOS-PEOU sols would flow into the microchannels a few millimeters and then stop. Part of the poor filling properties of this sol can be attributed to the increased viscosity and hydrophobicity associated with PEOU. Partial filling followed by cessation of flow also suggests that a change in the sol properties occurs during mold filling. Increasing viscosity, surface tension, or even premature gelation would all yield the observed behavior. It was found that PDMS cubes absorbed alcohol (the solvent used in sols.) Selective removal of solvent, e.g., ethanol, from the sol in the mold would explain the poor mold-filling observations. A decrease in the relative ethanol concentration would increase sol viscosity and surface tension, inhibiting flow.

Selective absorption of ethanol from the sol was inhibited by pre-wetting the PDMS master in ethanol prior to introducing sols into the molds. Ethanol pre-wetting proved successful in facilitating mold filling with sols.

Initially, the mold was pre-wet with solvents by immersing the entire mold in the solvent, removing the mold from the solvent and blowing excess solvent from the mold surface. A presently more preferred method of solvent pre-wetting involves selective pre-wetting of the channels in the mold. Solvent (ethanol) is introduced into the reservoirs and allowed to fill the channels by capillary action. The solvent is allowed to absorb into the mold and excess solvent is blown out of the mold. Solvent channel wetting is done just prior to introduction of the micro-molding fluid into the mold.

The integrity of the PDMS-glass substrate contact may be compromised by using certain pre-wetting procedures. When sols were cast in pre-wet PDMS masters that had been fully immersed in the solvent, partial sol underflow between the PDMS and the glass substrate was observed. Underflow did not, however, appear to alter the microscopic properties of the devices made. Preferably care should be taken to avoid underflow between channels.

The foregoing examples are intended to illustrate the invention and are in no way intended to limit its scope. Those of ordinary skill in the art will appreciate that materials, methods, reactions, procedures and techniques other than those specifically described herein can be readily used or routinely adapted to practice the method of this invention. All such materials, methods, reactions, procedures and techniques that are functionally equivalent to the specific methods described or that can be readily used or that can be routinely adapted for use in this invention are encompassed by the spirit and scope of this invention.

All references cited herein are incorporated in their entirety by reference herein.

We claim:

1. A method for patterning a material onto a substrate which comprises the steps of:
   a. providing a micro-mold having a plurality of non-communicating, independent channels and having a plurality of reservoirs for receiving a micro-molding fluid each of which reservoirs communicates with a channel, said mold comprising an elastomeric master having a surface with a plurality of recesses therein and a substrate, said mold formed by contacting the surface of said elastomeric master with said substrate such that the recesses in said surface form said plurality of reservoirs and channels;
   b. introducing a micro-molding fluid into said mold reservoirs filling said communicating channels; and
   c. solidifying said fluid in said mold and removing said elastomeric master thereby generating a pattern of material on said substrate.

2. The method of claim 1 wherein said substrate is a material selected from the group consisting of glass, sapphire, Si/SiO$_2$, Ti/TiO$_2$, a metal oxide, a metal nitride, a semiconductor material and a non-reactive metal.

3. The method of claim 1 wherein said molding fluid is a sol.

4. The method of claim 3 wherein said molding fluid is an aqueous sol.

5. The method of claim 3 wherein said sol is an inorganic sol.

6. The method of claim 3 wherein said sol is an organically-modified inorganic sol.

7. The method of claim 3 wherein said sol comprises an indicator dye.

8. The method of claim 3 wherein said sol comprises a biologically active component.

9. The method of claim 1 wherein said patterned substrate comprises independent patterns each comprising different materials formed by introducing two or more different micro-molding fluids into different reservoirs of said micro-mold.

10. The method of claim 9 wherein said micro-molding fluids are sols each of which comprises a different indicator dye.

11. The method of claim 10 wherein said indicator dyes are selected from the group of indicator dyes for pH, $Ca^+$ or glucose.

12. The method of claim 9 wherein said micro-molding fluids are selected from the group of a prepolymer or monomer solution, an inorganic salt solution, a latex solution, an inorganic sol or an organically-modified inorganic sol.

13. The method of claim 9 wherein one or more of said micro-molding fluids comprises an indicator dye.

14. The method of claim 9 wherein one or more of said micro-molding fluids comprises a biologically active component.

15. The method of claim 1 wherein said fluid is solidified at a temperature less than or equal to about 100° C.

16. The method of claim 1 wherein said substrate is patterned to comprise an optical waveguide.

17. The method of claim 1 wherein said substrate is patterned to comprise a sensor.

18. The method of claim 1 wherein said substrate to be patterned is within a micro fluid channel.

19. The method of claim 1 further comprising a step of pre-wetting said mold channels prior to introduction of said micro-molding fluid.

20. The method of claim 19 wherein said pre-wetting step is done by dipping said mold in an appropriate solvent.

21. The method of claim 19 wherein said solvent is a lower alcohol.

22. The method of claim 19 wherein said alcohol is ethanol.

23. A method for patterning a substrate which comprises the steps of:
   a. providing a micro-mold having a plurality of channels for receiving a micro-molding fluid said mold comprising an elastomeric master having a surface with a plurality of recesses therein and said substrate, said mold formed by contacting the surface of said master with said substrate such that the recesses in said surface form said plurality of channels;
   b. introducing a micro-molding fluid which is a sol into said channels; and
   c. solidifying said sol in said mold and removing said elastomeric master thereby generating said patterned substrate.

24. The method of claim 23 wherein said sol is an aqueous sol.

25. The method of claim 23 wherein said sol is solidified by gelling and subsequently aged to generate said patterned substrate.

26. The method of claim 23 wherein said sol comprises a precursor of a metal oxide.

27. The method of claim 26 wherein said precursor is an metal alkoxide or mixture of metal alkoxides.

28. The method of claim 27 wherein said precursor is a mixture of alkoxides of different metals.

29. The method of claim 23 wherein said sol comprises an organosilane.

30. The method of claim 29 wherein said organosilane is an alkoxysilane.

31. The method of claim 30 wherein said alkoxysilane is a tetraalkoxysilane.

32. The method of claim 31 wherein said sol further comprises a silane functionalized polymer or prepolymer.

33. The method of claim 32 wherein said silane functionalized polymer or prepolymer is an alkoxysilane.

34. The method of claim 33 wherein said silane functionalized polymer is an N-trialkoxysilylpropyl-O-polyethyleneoxide urethane.

35. The method of claim 23 wherein said sol comprises an indicator dye.

36. The method of claim 35 wherein said indicator dye is a fluorescent dye.

37. The method of claim 23 wherein said sol comprises a biologically active component.

38. The method of claim 37 wherein said biologically active component is selected from the group consisting of proteins, enzymes, antibodies, antigens, nucleic acids, whole cells or cell fractions.

39. The method of claim 23 wherein said patterned substrate is within a micro fluidic channel.

40. The method of claim 39 wherein said patterned substrate provides a plurality of sensing elements within said micro fluidic channel.

* * * * *

UNITED STATES PATENT AND TRADEMARK OFFICE
CERTIFICATE OF CORRECTION

PATENT NO.   : 6,039,897
DATED        : March 21, 2000
INVENTOR(S)  : Lochhead et al.

It is certified that error appears in the above-identified patent and that said Letters Patent is hereby corrected as shown below:

Column 2,
Line 63, please replace "device" with -- devices --.

Column 4,
Line 12, after "aspect" please insert -- , --.

Column 5,
Line 27, after "replicating" please insert -- the --.
Line 53, please replace "FIG. IF" with -- FIG. 1F --.

Column 6,
Line 28, please replace "Alternative" with -- Alternatively --.
Line 42, please replace "acid" with -- acids --.

Column 7,
Line 48, after "can be" please insert -- added --.

Column 8,
Line 3, after "into the" please insert -- microchannels --.
Line 10, please replace "filing" with -- filling --.
Line 12, after "could be" please insert -- filled --.
Line 14, please replace "form" with -- from --.
Line 20, please replace "filing" with -- filling --.
Line 21, please replace "filing" with -- filling --.
Line 24, please replace "filing" with -- filling --.
Line 40, please replace "side" with -- wide --.

Column 9,
Line 24, please replace "50" with -- (50 --.
Line 25, please replace "taller" with -- taller) --.
Line 32, after "sol-gel sensor materials" please insert -- that --.
Line 51, please replace "reagents)responsive" with -- reagents) responsive --.

UNITED STATES PATENT AND TRADEMARK OFFICE
CERTIFICATE OF CORRECTION

PATENT NO. : 6,039,897
DATED : March 21, 2000
INVENTOR(S) : Lochhead et al.

It is certified that error appears in the above-identified patent and that said Letters Patent is hereby corrected as shown below:

Column 10,
Line 17, after "mask" please insert -- , --.
Line 39, after "substrate" please insert -- , --.
Line 39, after "slide" please insert -- , --.

Column 11,
Line 37, after "applied" please insert -- , --.

Signed and Sealed this

Fifth Day of February, 2002

Attest:

JAMES E. ROGAN
*Attesting Officer*  *Director of the United States Patent and Trademark Office*